United States Patent
Hryhorenko et al.

(10) Patent No.: US 6,221,563 B1
(45) Date of Patent: Apr. 24, 2001

(54) METHOD OF MAKING AN ORGANIC ELECTROLUMINESCENT DEVICE

(75) Inventors: Ewhen Hryhorenko, Rochester; Steven A. Van Slyke, Pittsford, both of NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/372,963

(22) Filed: Aug. 12, 1999

(51) Int. Cl.[7] .................................. H01J 1/63; H01J 1/72
(52) U.S. Cl. .................. 430/315; 430/319; 430/321; 313/504
(58) Field of Search .................... 430/315, 319 430/321; 313/504

(56) References Cited

U.S. PATENT DOCUMENTS

| | | |
|---|---|---|
| 4,356,429 | 10/1982 | Tang . |
| 4,539,507 | 9/1985 | VanSlyke et al. . |
| 4,720,432 | 1/1988 | VanSlyke et al. . |
| 4,769,292 | 9/1988 | Tang et al. . |
| 4,885,211 | 12/1989 | Tang et al. . |
| 5,047,687 | 9/1991 | VanSlyke . |
| 5,059,862 | 10/1991 | VanSlyke et al. . |
| 5,061,617 | 10/1991 | Maskasky . |
| 5,061,687 | 10/1991 | Takada et al. . |
| 5,071,055 | 12/1991 | Grauleau et al. . |
| 5,294,870 | 3/1994 | Tang et al. . |
| 5,701,055 | * 12/1997 | Nagayama et al. .................... 313/504 |
| 6,037,712 | * 3/2000 | Codama et al. ...................... 313/498 |
| 6,111,356 | * 8/2000 | Roitman et al. ...................... 313/506 |

* cited by examiner

Primary Examiner—John A. McPherson
(74) Attorney, Agent, or Firm—Raymond L. Owens

(57) ABSTRACT

A method of making an organic electroluminescent (EL) device, includes providing positive photoresist layer a plurality of laterally spaced and electrically insulative pedestal strips in a spatial relationship over anode electrodes disposed on a substrate; forming an undercut-promoting crosslinking inhibition layer over the pedestal strips, and of a material which produces a diffusable crosslinking inhibition agent; providing and patterning an image reversal photoresist layer on the undercut-promoting inhibition layer into an organic vapor deposition mask oriented over each pedestal strip, and having undercut side surfaces which merge with continuous curvature into a mask top surface and wherein the crosslinking inhibition agent has diffused into the organic vapor deposition mask; forming an organic EL-medium layer between adjacent masks; and forming a plurality of cathode electrodes over the organic EL-medium layer, with the cathode electrodes being laterally spaced by the organic masks.

8 Claims, 8 Drawing Sheets

METHOD OF MAKING AN ORGANIC ELECTROLUMINESCENT DEVICE

FIELD OF THE INVENTION

The present invention generally relates to a method of making an organic electroluminescent (EL) device, and more particularly, to a method of making such a device by forming integral vapor deposition masks on a substrate for vapor deposition of an organic EL-medium and of cathode electrodes, wherein the integral vapor deposition masks are formed in a layer of an image reversal photoresist material and in alignment with underlying pedestal strips formed on the substrate from a layer of a conventional positive photoresist material.

BACKGROUND OF THE INVENTION

Organic electroluminescent devices (hereinafter referred to as organic EL devices) have evolved rapidly from relatively simple structures to relatively complex organic EL display panels comprised of a large number of light-emitting pixels arranged in rows and intersecting columns for display of images or of alphanumeric characters. As the development of organic EL devices proceeds from a research environment via prototype fabrication to a manufacturing stage, new methods of making such devices have to be devised in a manner which is compatible with processing steps and processing equipment typically found in clean room facilities of a modem semiconductor manufacturing plant.

In one form an organic EL display device is constructed as follows: on a light-transmissive substrate are provided a series of parallel laterally spaced light-transmissive anode electrodes. An organic EL-medium is then formed on the light-transmissive substrate and on the light-transmissive electrodes. The EL-medium typically comprises several overlying thin layers of organic materials which, in combination, are capable of emitting light. A plurality of laterally spaced cathode electrodes is disposed over the EL-medium in an oriented direction with respect to the anode electrodes. Thus, a plurality of light-emitting pixels is formed in intersecting rows and columns, and a particular pixel can be stimulated to emit light when an electrical potential is applied between a particular anode electrode and a particular intersecting cathode electrode such that the anode electrode has a positive potential with respect to the cathode electrode. In this case, holes are injected from the anode electrode into the organic EL-medium, and electrons are injected from the cathode electrode into the organic EL-medium, and light emission from the organic EL-medium disposed between those electrodes results from a recombination of holes and electrons therein.

While it has been possible to pattern a plurality of light-transmissive anode electrodes (for example, anode electrodes comprised of indium tin oxide, also referred to as ITO) with high fidelity by photolithographic and etching processes, the forming of laterally spaced vapor deposited cathode electrodes of a definition and lateral spacing comparable to that achieved in forming the anode electrodes has remained a technological challenge. In early versions of organic EL devices, a cathode electrode forming material, for example, a magnesium:silver material capable of injecting electrons into the organic EL-medium layer, was vapor deposited onto the organic EL-medium layer through apertures formed in an aperture mask, whereby the aperture mask was positioned in contact with or in close proximity to the organic EL-medium layer.

A major event in forming a plurality of laterally spaced cathode electrodes was proposed by Tang et al. in commonly-assigned U.S. Pat. No. 5,294,870. In the Tang et al. disclosure, a plurality of equidistant polymeric walls or dividers are formed from a negative-working photoresist material. These walls have substantially vertical side surfaces and a top surface which is parallel with the substrate. The walls are constructed to have a certain height dimension so that an upper edge of the walls can cast a shadow relative to a line-of-sight vapor stream of a cathode electrode material which is directed under an angle at the device to be constructed.

Nagayama et al., in U.S. Pat. No. 5,071,055, disclose an organic EL display panel in which both an organic function layer (an EL-medium layer) and an overlying cathode electrode layer are formed by vapor deposition methods of respective materials through openings extending between adjacent electrical insulation ramparts which have an overhanging portion projecting in a direction parallel to a substrate.

The walls of the Tang et al. device and the ramparts of the Nagayama et al. device are constructed on the device to function as integral vapor deposition masks and, in that capacity, these masks provide a significant improvement of the method of forming laterally delineated layers of an EL-medium and of cathode electrodes when compared to the vapor deposition method through apertures in an aperture mask referred to earlier. However, the construction of such walls or ramparts as well as requirements imposed upon either the materials used for the walls or ramparts, or the patterning steps which are needed to achieve the particular cross sectional profiles of these elements, may not be compatible with the processing methods and equipment such as found in contemporary semiconductor-like manufacturing facilities.

Accordingly, it is desirable to devise methods of making an organic EL device in which an integral vapor deposition mask is formed on a substrate from materials and by process steps which are compatible with manufacturing equipment and procedures found in most contemporary semiconductor-like manufacturing facilities. Such facilities include programmable in-line track systems for coating layers of adhesion-promoting agents and of photoresist materials, for heating or baking such layers, and for developing patterns in a patternwise exposed photoresist layer.

SUMMARY OF THE INVENTION

It is an object of the present invention to provide an improved method of fabricating an organic EL device using an integral vapor deposition mask.

This object is achieved by a method of making an organic electroluminescent (EL) device, comprises:

(a) providing positive photoresist layer a plurality of laterally spaced and electrically insulative pedestal strips in a spatial relationship over anode electrodes disposed on a substrate;

(b) forming an undercut-promoting crosslinking inhibition layer over the pedestal strips, and of a material which produces a diffusable crosslinking inhibition agent;

(c) providing and patterning an image reversal photoresist layer on the undercut-promoting inhibition layer into an organic vapor deposition mask oriented over each pedestal strip, and having undercut side surfaces which merge with continuous curvature into a mask top surface and wherein the crosslinking inhibition agent has diffused into the organic vapor deposition mask;

(d) forming an organic EL-medium layer between adjacent masks; and (e) forming a plurality of cathode electrodes over the organic EL-medium layer, with the cathode electrodes being laterally spaced by the organic masks.

An advantage of the present invention resides in the use of commercially available photoresist materials, adhesion-promoting materials, and crosslinking inhibition materials for fabricating organic pedestals on a substrate and organic vapor deposition masks over the pedestals, such materials being compatible with process sequences and processing equipment found in a semiconductor-like manufacturing facility. Another advantage of the method of the present invention is that the organic vapor deposition mask can be formed to offer high edge definition of vapor deposited layers, as well as high resolution of light-emitting pixels, and the capacity of achieving smaller pixel dimensions commensurate with the pattern fidelity obtainable with an integral vapor deposition mask formed from photoresist materials in accordance with an aspect of the present invention.

BRIEF DESCRIPTION OF THE DRAWINGS

FIG. 6A shows an adhesion layer and a positive photoresist layer over the adhesion layer, with a pedestal strip-forming pattern of activating radiation exposing the positive photoresist layer;

FIG. 6B shows pedestal strips formed after developing the patternwise exposed positive photoresist layer of FIG. 6A;

FIG. 6C indicates a heating step wherein the pedestal strips of FIG. 6B are heated sufficiently to crosslink the positive organic photoresist material of the pedestal strips;

FIG. 6D is intended to indicate completed formation of the organic pedestal strips;

FIG. 6E shows a crosslinking inhibition layer formed on the substrate and over the pedestal strips of FIG. 6D;

FIG. 6F shows a mask-forming image reversal photoresist layer formed over the inhibition layer;

FIG. 6G depicts a patterned exposure to activating radiation of the image reversal photoresist layer in regions substantially congruent with a top surface of the pedestal strips;

FIG. 6H indicates a heating step of the substrate wherein an undercut-promoting crosslinking inhibition agent is produced by the inhibition layer, the agent diffusing a distance into the mask-forming image reversal photoresist layer;

FIG. 6I shows a uniform exposure to activating radiation of the mask-forming image reversal photoresist layer;

FIG. 6J is a view of the completed vapor deposition masks resulting after developing the mask-forming photoresist layer of FIG. 6I.

Since organic EL device features such as layer thickness dimensions are frequently in sub-micrometer ranges, while features representing lateral dimensions of an organic EL device can have significantly larger dimensions, the drawings are scaled for ease of visualization rather than dimensional accuracy. Also, for clarity of presentation, multiple layers forming the organic EL-medium layer have been omitted from the cross sectional views.

DETAILED DESCRIPTION OF THE INVENTION

Figure 1A:
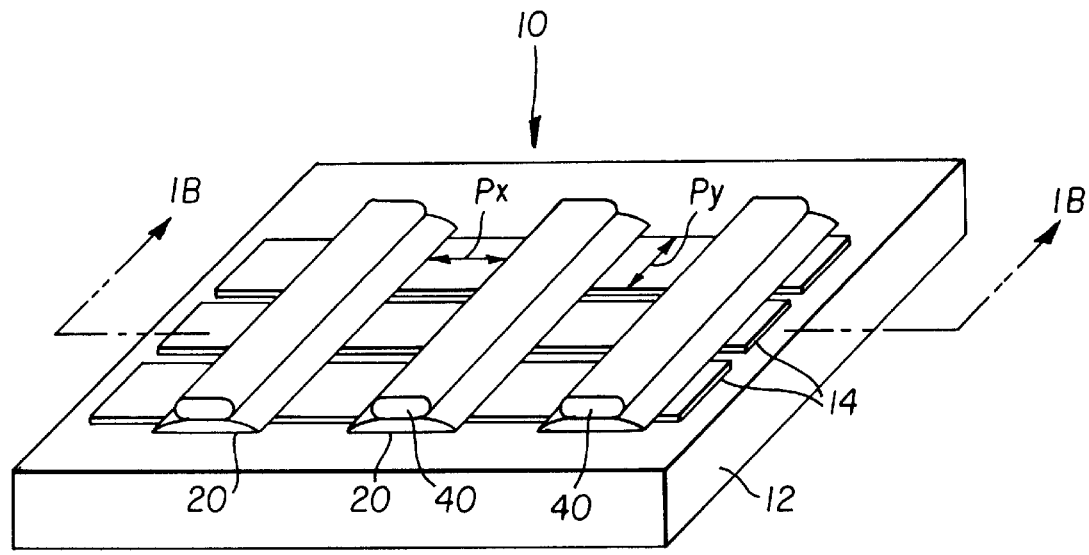
FIG. 1A is a schematic perspective view of an organic EL device shown at a stage of fabrication in which organic vapor deposition masks have been formed over organic pedestal strips disposed over anode electrodes formed on a substrate, in accordance with the present invention.
Figure 1B:
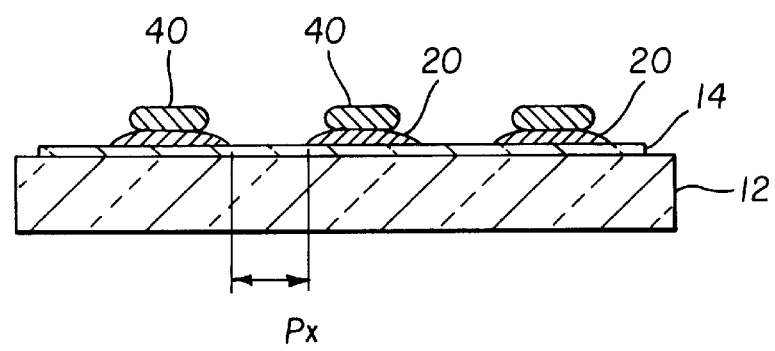
FIG. 1B is a schematic cross sectional view of the device shown in FIG. 1A, taken along the lines 1B—1B.
Figure 5:
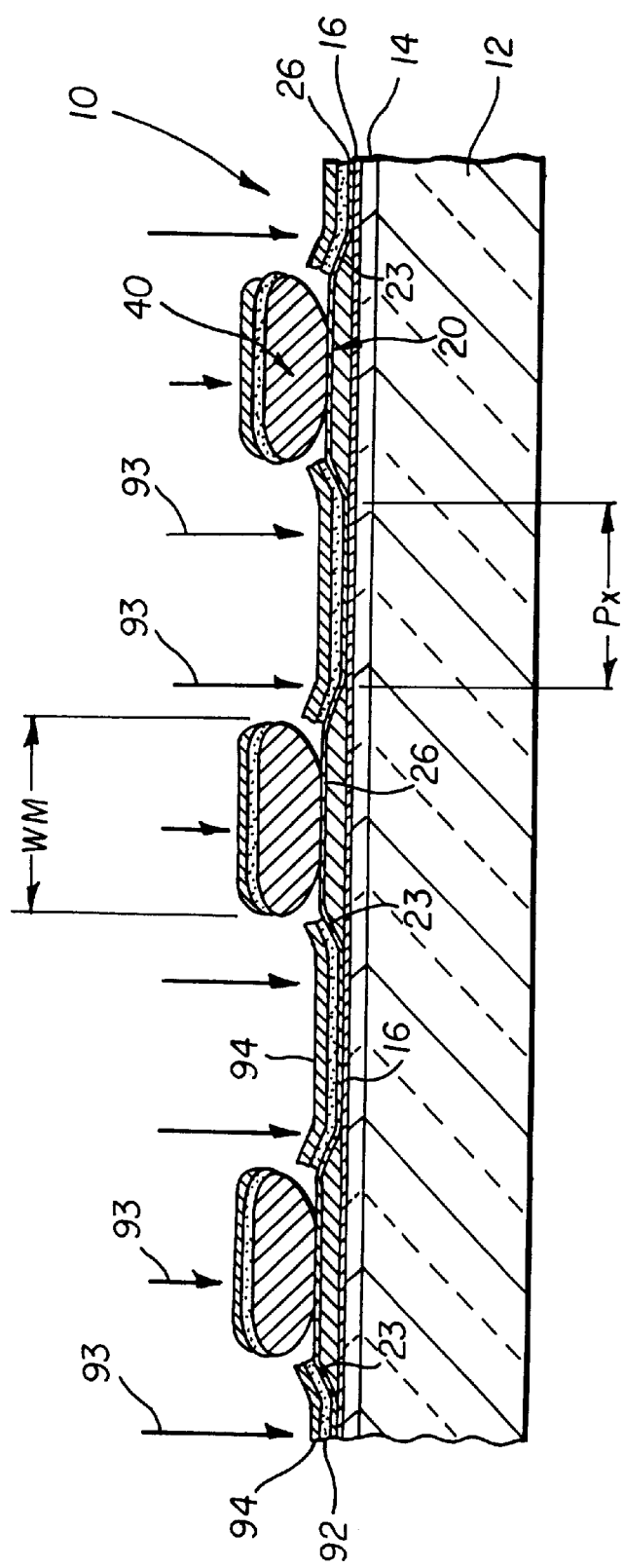
FIG. 5 is a schematic cross sectional view, similar to the view shown in FIG. 4, depicting the formation of cathode electrodes over the organic EL-medium layer by vapor depositing a cathode electrode material over and between the organic vapor deposition masks, in accordance with the present invention.

Referring now to FIGS. 1A and 1B, there is shown a schematic perspective view and a cross sectional view, respectively, of an organic EL device generally designated at 10, although an organic EL-medium layer and cathode electrodes have been omitted from these figures to preserve clarity of presentation (a cross sectional view of a completed organic EL device is shown in FIG. 5).

On one surface of a light-transmissive substrate 12 are provided a plurality of laterally spaced light-transmissive anode electrodes 14. The light-transmissive substrate 12 can be a glass plate or a quartz plate, and the light-transmissive electrodes 14 are preferably formed of indium tin oxide (ITO) and having a desired value of electrical conductivity, a desired value of optical transparency, and a thickness in a range of 0.05–0.25 micrometer. A plurality of organic, electrically insulative laterally spaced pedestal strips 20 are formed over the anode electrodes 14 and over the substrate 12 in an oriented spatial relationship with respect to the anode electrodes 14 such as, for example, an orthogonal spatial relationship. An organic vapor deposition mask 40 is formed from a photoresist layer over each of the pedestal strips 20, and centrally disposed thereon. Lateral dimensions of light-emitting pixels still to be formed over the anode electrodes 14 and between the vapor deposition masks 40 are identified to have a pixel dimension $P_x$ in an x-direction and $P_y$ in a Y direction of the device 10, wherein the pixel dimension $P_x$ is a dimension of light emission of a pixel which extends between adjacent pedestal strips 20.

Figure 2:
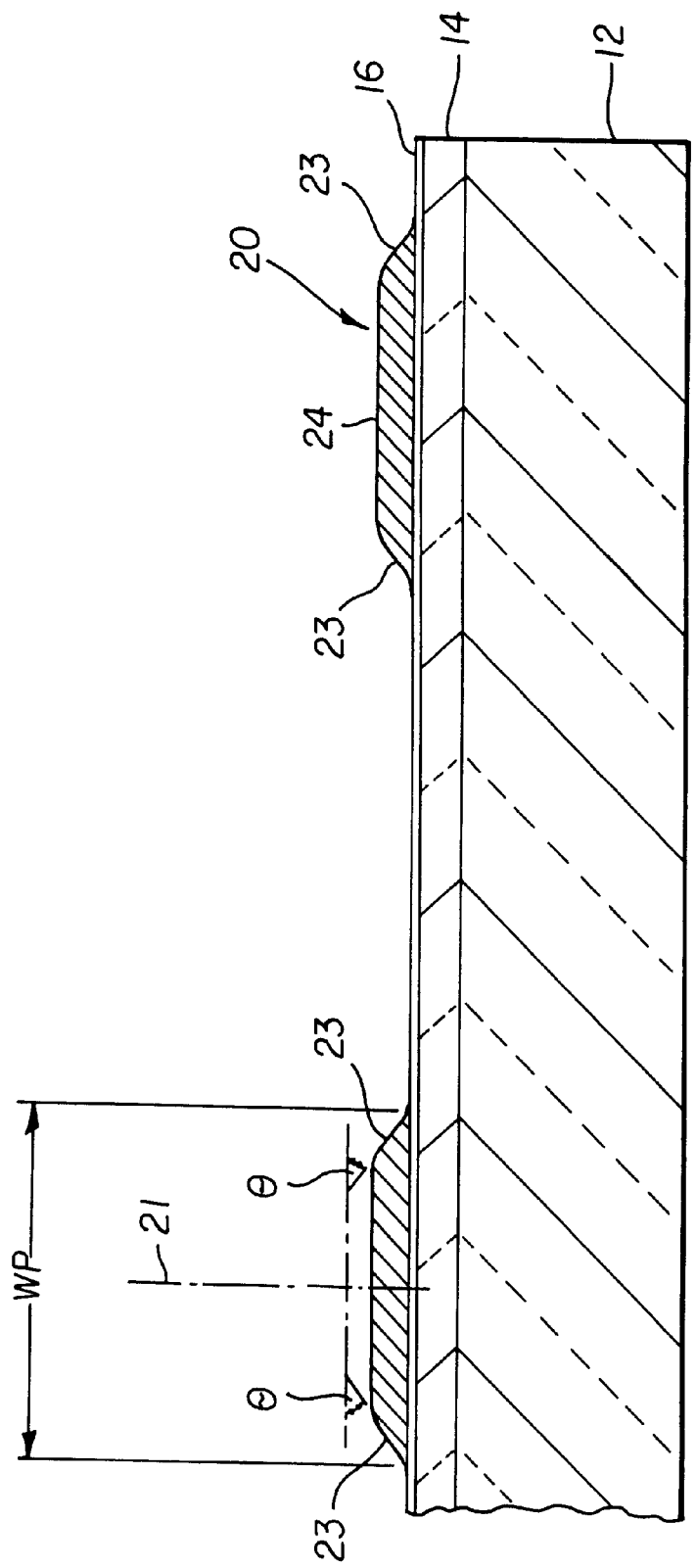
FIG. 2 is an enlarged cross sectional view of the device depicting the pedestal strips and detailing features pertaining thereto.
Figure 3:
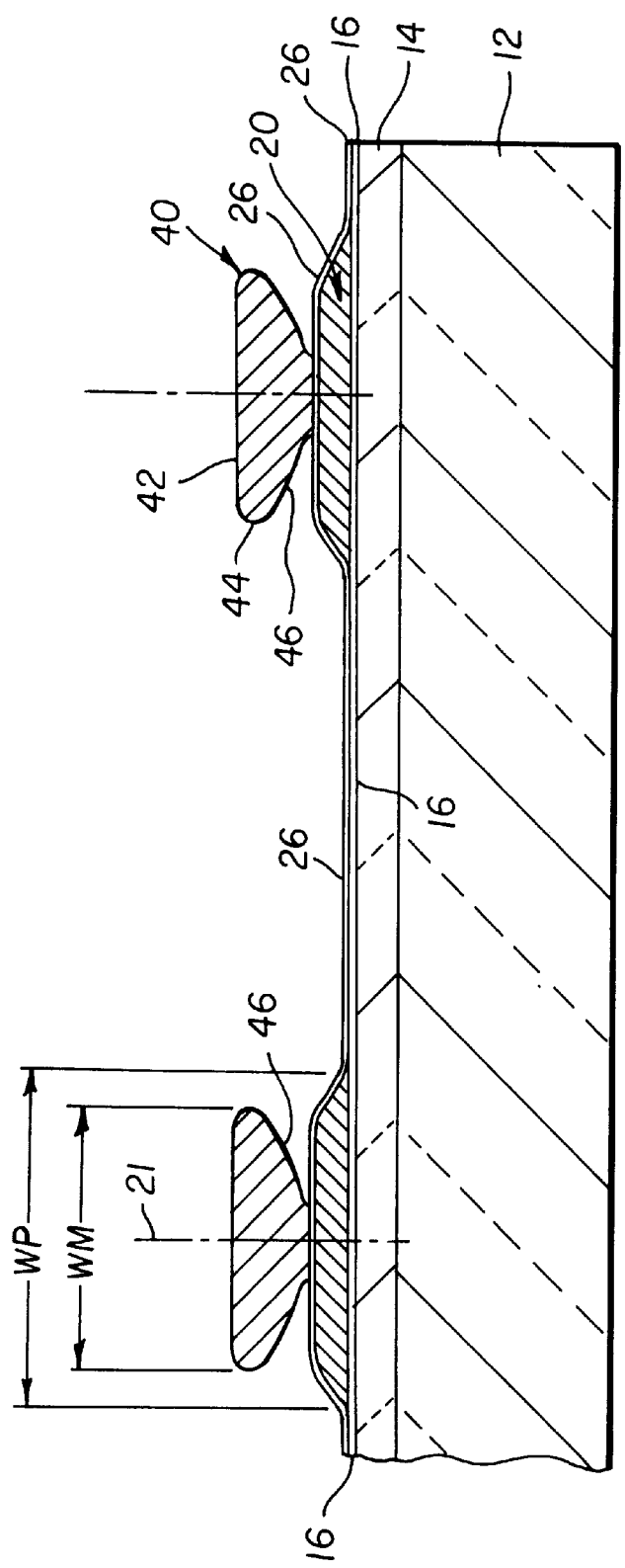
FIG. 3 shows, in an enlarged cross sectional view, the device of FIG. 1A in which organic vapor deposition masks with undercut side surfaces have been formed over a crosslinking inhibition layer disposed over the pedestal strips of FIG. 2, in accordance with the present invention.

Turning now to FIGS. 2 and 3, there are shown enlarged cross sectional views similar to that shown in FIG. 1B, but providing greater detail of features related to the pedestal strips 20 and the vapor deposition masks 40. An adhesion layer 16 is formed over the substrate and over the anode electrodes 14, and pedestal strips 20 are formed over the adhesion layer 16 by a sequence of process steps detailed hereinafter with particular reference to FIGS. 6A–6D. Each of the pedestal strips 20 has upwardly sloping side surfaces 23 which merge at a pedestal top surface 25 which extends in a direction substantially parallel with the surface of the substrate 12. The pedestal strips 20 have a pedestal width dimension WP which includes the pedestal top surface 25 and both pedestal side surfaces 23. The pedestal side surfaces 23 are sloped at an angle Θ with respect to the pedestal top surface 24, where the angle Θ is preferably less than 60 degrees. A center line 21 indicates the center of the width dimension WP of a pedestal strip 20.

Upon forming the pedestal strips 20 from a layer of a conventional organic positive photoresist material, the pedestal strips are heated to a temperature sufficient to cause the photoresist material of each pedestal strip to crosslink so as to form structurally and chemically stable pedestal strips over which the vapor deposition masks 40 are formed by a sequence of process steps to be described hereinafter with particular reference to FIGS. 6E–6J. The crosslinked pedestal strips are substantially inert with respect to solvents contained in the precursor materials which are to be used for forming subsequent layers over the pedestal strips.

An undercut-promoting crosslinking inhibition layer 26 is formed over the pedestal strips 20 and over such portions of the anode electrodes 14 and of the substrate which remain between the pedestal strips. This layer 26 is of a material which will produce and release crosslinking inhibition agents when heated to a release temperature and will, in conjunction with a sequence of particular process steps (to be detailed hereinafter), provide an organic vapor deposition mask 40 centered over each pedestal strip 20, and having undercut side surfaces 46 which are continuously curved, merging with a curvature 44 to a mask top surface 42. The mask top surface 42 is substantially parallel with the pedestal strip top surface 24. The vapor deposition mask 40 has a mask width dimension WM which is smaller than the pedestal width dimension WP, and which is centered on the center line 21. A preferred ratio of WM/WP has a value in a range of 0.4 to 0.95.

Figure 4:
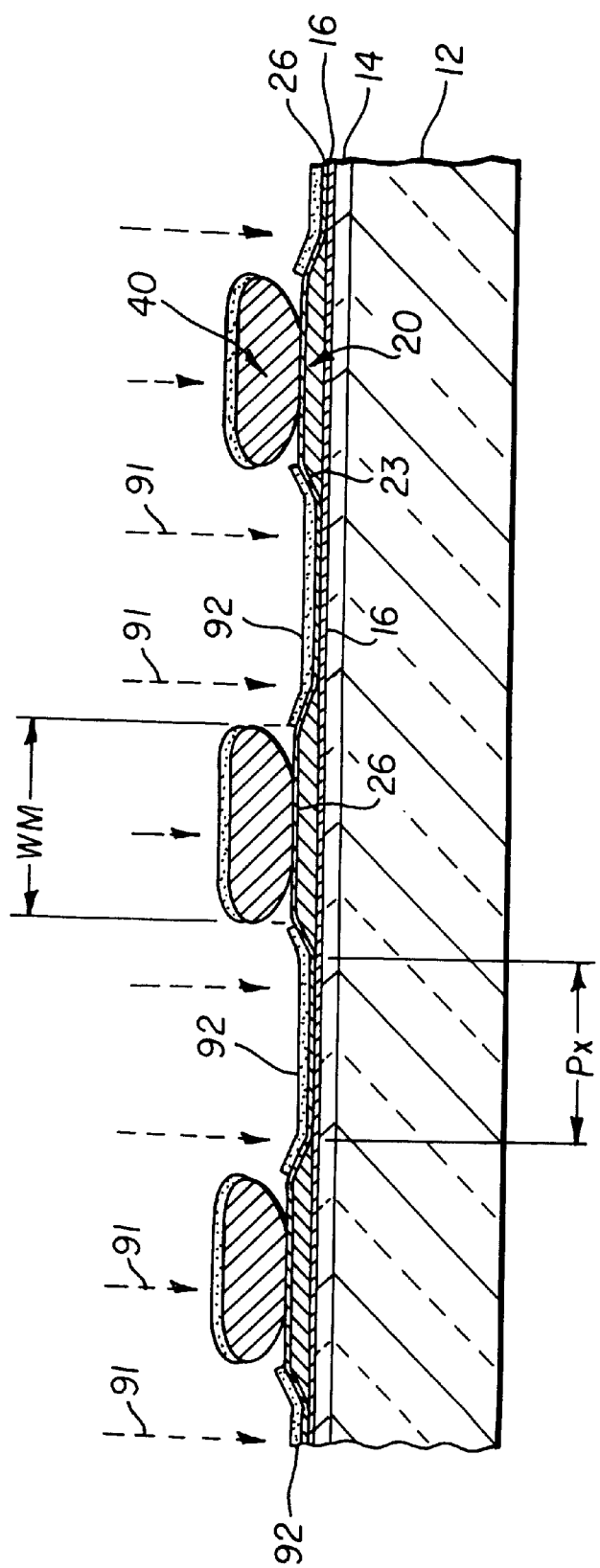
FIG. 4 is a schematic cross sectional view of the organic EL device, and indicating the forming step of an organic EL-medium layer by vapor depositing an organic EL material over and between the organic vapor deposition masks, in accordance with the present invention.

Referring now to FIG. 4, the integral vapor deposition masks 40 are used to form an organic EL-medium layer 92 between adjacent masks by vapor deposition from an organic EL-medium vapor stream 91 which is directedsubstantially vertically toward the device surface from a vapor source of organic EL material (not shown). The organic EL-medium layer 92 is also formed over the top surfaces of the masks 40. Since the width dimension WM of the masks 40 is smaller than the width dimension WP of the underlying pedestal strip 20, the organic EL-medium layers 92 terminate laterally over the sloped pedestal side surfaces 23, thereby providing an effective pixel width dimension $P_x$ of the organic EL-medium layer 92.

The organic EL materials from which the layer 92 is formed can be selected from among materials, configuration of layers, and preferred layer thicknesses of conventional organic EL devices such as those described by commonly-assigned U.S. Pat. Nos. 4,356,429; 4,539,507; 4,720,432; 4,885,211; 4,769,292; 5,047,687; 5,059,862; and 5,061,617, the disclosures of which are herein incorporated by reference. It has been found to be advantageous to form the organic EL-medium layer 92 from at least three organic sub-layers which are vapor deposited in sequence to form the layer 92. Thus, an organic hole-transporting layer is formed first, followed by forming an organic light-emitting layer over the hole-transporting layer, and then forming an organic electron transporting layer over the light-emitting layer. In forming the organic light-emitting layer, it is advantageous to co-deposit a light-emitting organic host material and at least one fluorescent organic dopant material which together form the light-emitting layer as part of the organic EL-medium layer 92.

The vapor deposition of the layer 92 (and each of the aforementioned sub-layers) can be accomplished by providing a vapor stream 91 of organic EL materials from a conventional vapor deposition source contained in a vacuum system, and alternatively the vapor stream 91 can be provided by an organic EL donor coating formed on a donor support. The donor support is disposed in proximity to the mask top surfaces 42 of the masks 40 such that the donor coating faces the masks. In this method of vapor deposition, the donor coating vaporizes upon heating of the donor support, and is transferred via the vapor stream 91 from the donor support to the device to form the layers 92 thereon.

Turning now to FIG. 5, the cathode electrodes 94 are formed over the EL-medium layer 92 by vapor depositing a cathode electrode material as indicated schematically by the cathode electrode material vapor stream 93. Thus, FIG. 5 shows a completed organic EL device 10 having the integral organic vapor deposition masks 40 formed over the pedestal strips 20 and the vapor deposited layers 92 and 94.

Before continuing with the detailed description of the remaining drawings, a brief discussion of the photolithographic performance of a conventional positive photoresist layer and of an image reversal photoresist layer may be useful to better understand the invention:

i) a conventional positive photoresist layer includes a novolak resin and a diazonapthoquinone compound which is primarily responsive to exposure by activating radiation. In an exposed region of the layer, an indene carboxylic acid photo product is generated which represents a latent image. In a pattern developing step, an alkaline developer (for example, a tetramethylammonium-based developer) contacts the photoresist layer. The dissolution rate of the exposed portion (containing the acid photo product) of the layer is significantly higher than the dissolution rate of the unexposed portion of the layer during the developing step. Thus, a substantially unmodified (not dissolved) portion of the unexposed layer remains as the "image feature" upon completion of the developing step. During a subsequent heating step this "image feature" can be effectively crosslinked on a molecular level within the layer, so as to render this feature mechanically and chemically stable, and substantially inert with respect to solvents which may be present during formation of subsequent layers over the "image feature." Crosslinking may also be achieved by exposure of the "image feature" to deep ultraviolet radiation while applying heat, a crosslinking process well established in the practice of photolithography. Such molecularly crosslinked features are substantially electrically insulative.

A conventional positive photoresist, as well as the basic process steps described above, is used in the practice of the present invention to form the pedestal strips 20.

ii) an image reversal photoresist layer includes a novolak resin and a diazonaphtho-quinone-sulfonate compound which is primarily responsive to exposure by activating radiation. In an exposed region of the layer, an indene sulfonic acid photo product is generated which represents a latent image. The indene sulfonic acid is a stronger acid than the aforementioned indene carboxylic acid. In contrast to the conventional positive photoresist processing described under i) above, the image reversal photoresist layer is now heated to a temperature at which the sulfonic acid functions as a catalyst to cause acid-catalyzed crosslinking of the previously exposed portion of the layer to provide an insoluble molecularly crosslinked portion which is substantially unaffected by an alkaline developer. The entire layer (i.e., both the previously unexposed and exposed portions thereof) is then uniformly exposed to activating radiation. The previously exposed portion of the layer, now crosslinked, is not affected by the uniform exposure. The previously unexposed portion forms the aforementioned indene sulfonic acid during uniform exposure. In a pattern developing step, an alkaline developer will provide for a relatively high dissolution rate of that portion of the layer which had been uniformly exposed to activating radiation, while the initially exposed portion, effectively crosslinked, remains as the "image feature."Thus, an image reversal photoresist layer and processing steps related thereto provide "image features" corresponding to initially exposed regions, while a conventional positive photoresist layer with its processing steps provide "image features" corresponding to unexposed regions.

An image reversal photoresist, as well as the basic process steps described above, is used in the practice of the present invention to form the vapor deposition masks 40.

However, in a key aspect of the invention, a crosslinking inhibition layer 26 is formed over the substrate and over the pedestal strips 20 before forming the image reversal photoresist layer thereover. Although the detailed mechanism of the function of the inhibition layer 26 is not fully understood at present, it is believed that the crosslinking inhibition layer releases a crosslinking inhibition agent during the heating step (which provides the crosslinking of the initially exposed portions of the photoresist layer). The crosslinking inhibition agent diffuses a distance into the overlying image reversal photoresist layer and inhibits or retards crosslinking. Crosslinking is retarded most strongly at an interface between the two layers, and progressively less strongly a distance into the image reversal photoresist layer due to a progressively lower concentration of the inhibition agent. Accordingly, continuously curved undercut side surfaces 46, 42 of the masks 40 are evolving during the pattern developing step in an alkaline developer.

A currently preferred material for forming the crosslinking inhibition layer is commercially available from Brewer Science, Inc. of Rolla, Mo., under the designation APX-K1. This material is available for the primary purpose of forming adhesion layers over substrates to provide adhesion of anoverlying photoresist layer. As such, the APX-K1 contains trimethoxysilane to promote adhesion to a substrate of glass, quartz, silicondioxide, and the like, and to promote adhesion of an organic photoresist layer to the adhesion layer. Other commercially available adhesion promoters include, for example, hexamethyldisilazane which is known as "HMDS" in short notation.

The APX-K1 includes additionally an amine compound (as 2-aminoethanol) and solvents. It has been observed that amine molecules are released by a layer formed on a substrate from the APX-K1 when the layer is heated for a period of time at a temperature in a range of 90–130° C. Although the details of a release mechanism are not fully understood at present, it is believed that such amine molecules are similarly released from the APX-K1 layer 26, and that the amine molecules diffuse a distance into an overlying layer of an image reversal photoresist. Thus, the crosslinking inhibition agent in the crosslinking inhibition layer is most likely an amine compound or amine molecules derived therefrom during a heating step.

It will be appreciated that the undercut and curved side surfaces 46, 42 of the vapor deposition masks 40 are not obtained when the crosslinking inhibition layer 26 (containing the amine compound) is replaced by a layer which merely includes an adhesion promoter, such as HMDS.

Figure 6A:
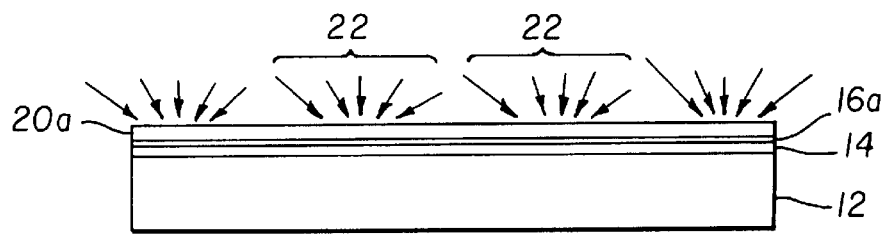
FIGS. 6A–6J are schematic side views of a substrate having an anode electrode thereon, and indicating, in sequence, the forming of organic pedestal strips (FIGS. 6A–6D), and the forming of organic vapor deposition masks formed over the pedestal strips (FIGS. 6E–6J)

Referring now particularly to FIGS. 6A–6D, there are depicted schematic side views representing different stages in the process of forming the pedestal strips 20. In FIG. 6A, a thin film of an adhesion layer 16a is formed over an anode electrode 14 disposed on the substrate 12. The adhesion layer can be formed from a conventional adhesion promoter such as HMDS as an adhesion layer 16, and alternatively, as depicted in FIGS. 6A–6D, the adhesion layer is formed from the amine-containing adhesion promoter APX-K1 discussed above. The adhesion layer 16a is used to ensure adhesion of a pedestal strip-forming conventional positive photoresist layer 20a formed on the adhesion layer 1 6a. The positive photoresist layer 20a is exposed to patterned activating radiation 22, with the pattern of activating radiation selected such that pedestal strips 20b are formed after development of the patternwise exposed positive photoresist layer 20a, and having the sloped pedestal side surfaces 23 and the pedestal top surface 24 described with reference to FIG. 2. To achieve the sloped pedestal side surfaces, the patterned radiation 22 exposing the photoresist layer 20a is defocused so as to provide unsharp edges of the exposed regions which, in turn, result in the sloped pedestal side surfaces. The converging arrows of patterning radiation 22 are intended to indicate this defocused or unsharp exposure condition. The term "activating radiation" is used here to describe the energy of radiation required to activate or to induce photochemical changes in a positive photoresist layer such that a pattern of photoresist features can be obtained in a subsequent photoresist developing step, for example, the pedestal strips 20b shown in FIG. 6B after the developing step.

Figure 6B:
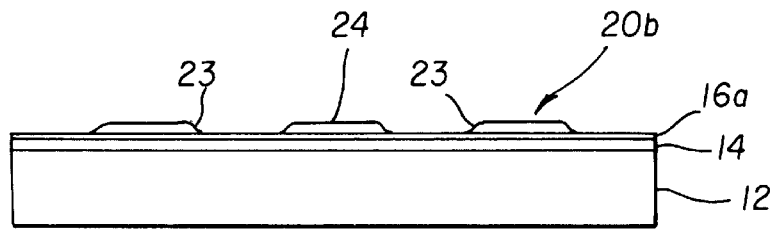
Figure 6C:
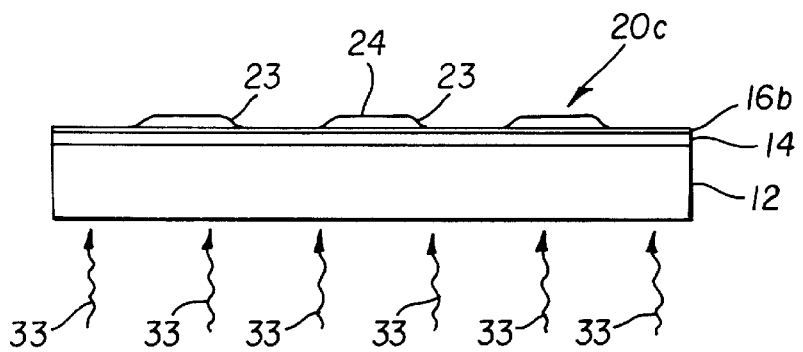

In FIG. 6C, the substrate 12 is heated with heat radiation 33, thereby heating the anode electrode 14, the adhesion layer 16a, and the pedestal strips 20b of FIG. 6B to a temperature sufficient to cause the positive photoresist of each of the pedestal strips to crosslink so as to form structurally and chemically stable pedestal strips designated at 20c. During this heating step, the adhesion layer 16a can also undergo changes of composition which is indicated by the designation 16b in FIG. 6C, and the angle 0 of the sloped pedestal side surfaces may be further reduced as well.

For example, if the adhesion layer 16a is formed of a material capable of producing a crosslinking inhibition agent when heated, the designation 16b of the adhesion layer in FIG. 6C would reflect the composition change. It should be noted that any production of a crosslinking inhibition agent in the adhesion layer 16a during the crosslink-inducing heating step will not promote a change of the pedestal strip side surfaces 23, since the pedestal strips have been formed in a developing step prior to the heating step and, more particularly, since the pedestal-forming conventional positive photoresist is not crosslinked by an acid-catalyzed mechanism.

As indicated in FIG. 6C, the heating step is preferably carried out by heating the substrate 12, for example, by drawing the substrate into a vacuum-induced contact with a temperature-controlled hot plate for a controlled duration. Such hot plates are frequently configured in-line on automated processing equipment. Other sources of heat radiation found on such equipment may provide heat radiation 33 directed from above, i.e., directed to be incident on the pedestal strips. In still other configurations, heat radiation 33 may be provided from above and from below such as, for example, by an in-line oven-like heating station.

Effective crosslinking of the pedestal strips can be achieved at temperature in a range of 150–250° C. maintained for a duration in a range of 1–6 minutes.

Figure 6D:
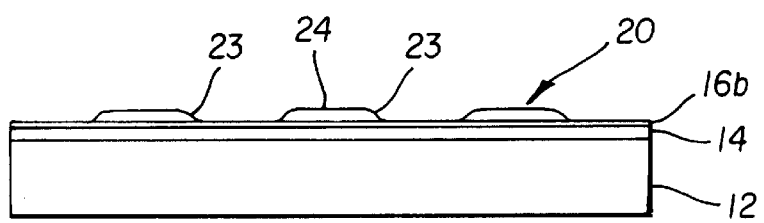

Finally, in FIG. 6D, the crosslinked pedestal strips are designated at 20, while maintaining the designation 16b for the adhesion layer at this stage of the process.

Referring now particularly to the sequence of FIGS. 6E–6J, there are shown stages of fabricating the organic photoresist masks 40.

Figure 6E:
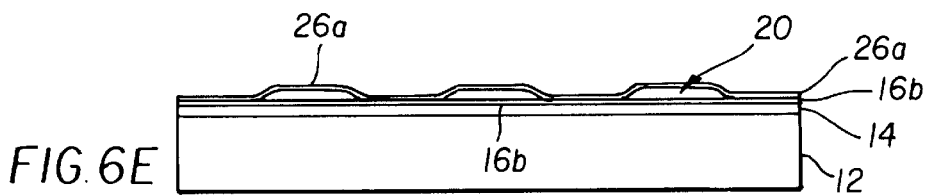

In FIG. 6E an undercut-promoting crosslinking inhibition layer 26a is formed over the pedestal strips 20 and over the adhesion layer 16b.

Figure 6F:
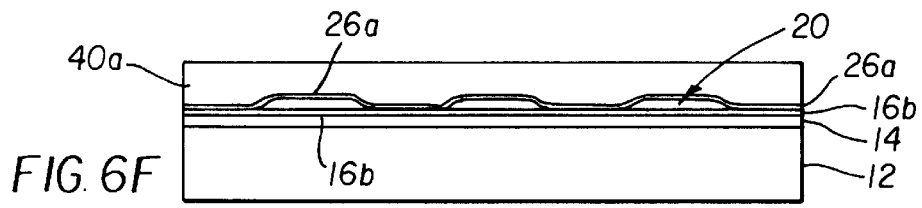

In FIG. 6F a mask-forming image reversal photoresist layer 40a is formed over the inhibition layer 26a.

Figure 6G:
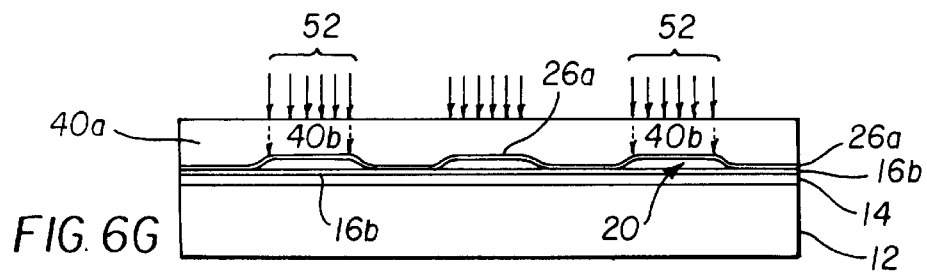

In FIG. 6G the mask-forming image reversal photoresist layer 40a is exposed to activating radiation 52 with a pattern which is selected to be substantially congruent with the top surfaces of the underlying pedestal strips 20. The patternwise exposed regions of the photoresist layer 40a are designated at 40b.

Figure 6H:
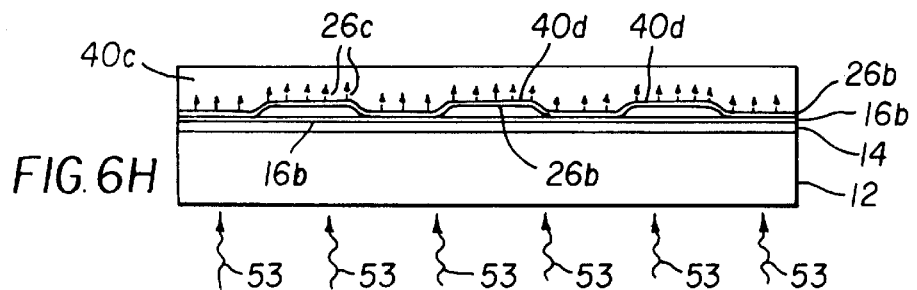

FIG. 6H depicts a heating step in which thermal radiation 53 heats the substrate 12 to a temperature sufficient to cause the crosslinking inhibition layer 26a to undergo a change in composition (designated as 26b) by producing and releasing a crosslinking inhibition agent, such as amine molecules, capable of diffusing a distance onto the image reversal photoresist layer, as schematically indicated by the arrows 26c. The image reversal photoresist layer having the crosslinking inhibition agent diffused a distance therein is now designated at 40c, and regions of the layer 40c previously exposed to activating radiation are now designated at 40d.

Figure 6I:
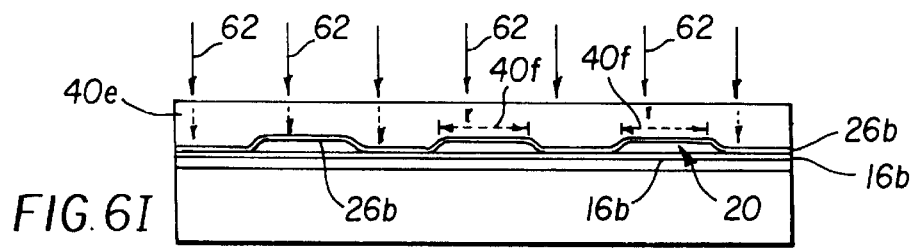

In FIG. 6I, a uniform exposure of activating radiation 62 is directed at the mask-forming photoresist layer, which is now designated at 40e in regions not previously patternwise exposed, and previously patternwise exposed regions overlying the pedestal strips 20 are now designated at 40f.

Figure 6J:
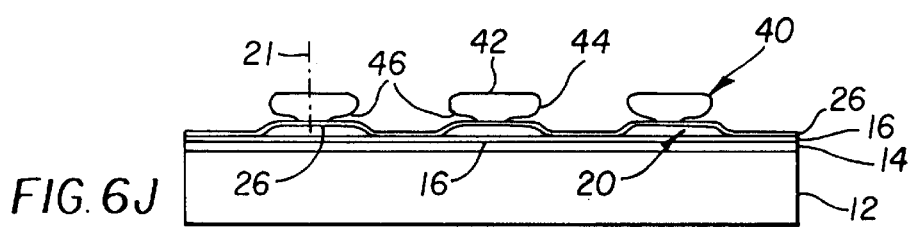

A pattern developing step in an alkaline developer of the photoresist layer 40e provides the vapor deposition masks 40 having the undercut and curved mask side surfaces 46 and 44 as shown in FIG. 6J (and depicted in greater detail in FIG. 3).

The heating step of FIG. 6H is depicted as providing heat radiation 53 at the substrate 12. However, any of the heating methods described with reference to FIG. 6C can be used. To produce the inhibition agent and to diffuse it (26c) a distance into the masking-forming photoresist layer, a temperature in a range of 90–120° C. is maintained for a duration in a range of 1–2 minutes.

The adhesion layer and the crosslinking inhibition layer can be formed by spin-coating using automated and programmable spin-coating stations which include programmable heating and cooling stations as well as cassette-to-cassette transport of substrates. An alternative method of forming the adhesion layer and the inhibition layer is a so-called "vapor-prime" approach which is well known to those skilled in the art of forming relatively thin layers. These layers may be coated to a preferred thickness in an range of 0.5–2.5 nm. The pedestal strip-forming photoresist layer 20a is coated to a thickness in a range of 0.2–1.5 micrometer, and the mask-forming image reversal photoresist layer 40a is coated to a thickness in a range of 1–3 micrometer. Spin-coating is a preferred method of providing these photoresist layers.

The patternwise exposure to activating radiation 22 of the pedestal strip-forming photoresist layer 20a (FIG. 6A) is provided via an appropriately patterned optical mask by a source of activating radiation having wavelengths in a range of 360–450 nm, either as a defocused proximity exposure or as a defocused projection exposure to achieve the sloped side surfaces 23 of the pedestal strips 20 (see FIG. 2). The slope of these side surfaces may be further reduced during a subsequent crosslinking heating step.

The patternwise exposure 52 of the mask-forming image reversal photoresist layer 40a of FIG. 6G is preferably provided by a collimated or focused source of activating radiation via an appropriately patterned and oriented optical mask to provide an exposure over a wavelength range from about 360–450 nm. The exposure 52 can be a projection exposure provided by a scanned radiation source, commonly referred to as a "scanner."

The uniform exposure to activating radiation 62 shown in FIG. 6I can be provided as collimated proximity exposure or as a scanned exposure.

The developing step of the pattern of pedestal strips 20 and the developing step of the pattern of masks 40 is preferably carried out on automated and programmable equipment commonly found in semiconductor-like manufacturing facilities.

Figure 7:
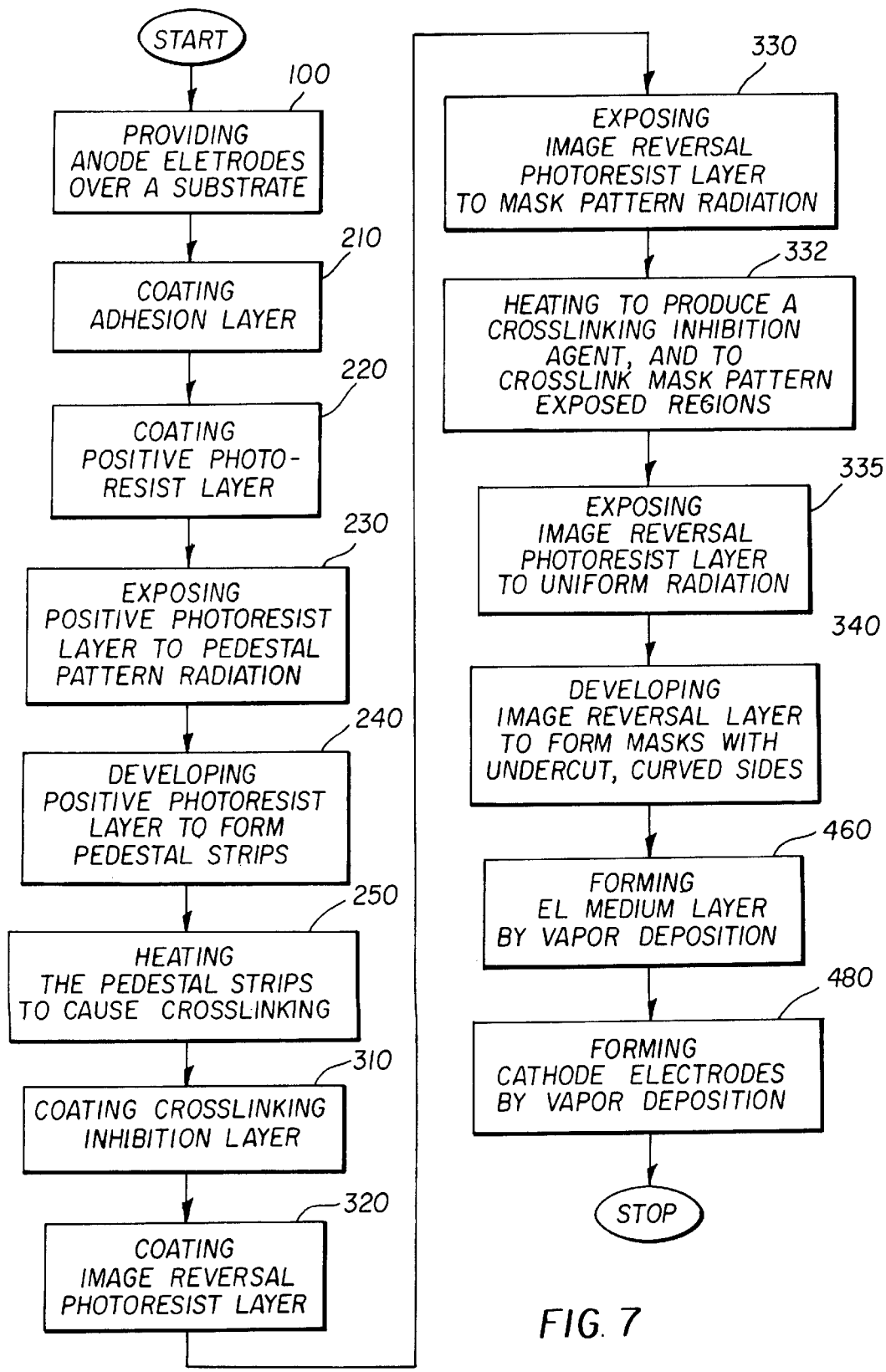
FIG. 7 is a schematic flow diagram of the sequence of processing steps involved in making an organic EL device, in accordance with the present invention.

Turning now to FIG. 7, there is provided a schematic flow diagram of process steps for fabricating an organic EL device in accordance with the invention. The numeral designations associated with the process steps are arbitrary, but the designations are reflective of programmable steps and procedures commonly employed in contemporary semiconductor or semiconductor-like manufacturing facilities.

Upon starting the sequence of processes, anode electrodes are provided over a substrate in step 100: an adhesion layer (the layer 16a of FIG. 6A) is coated in a step 210; in step 220, a positive photoresist layer, i.e., the layer 20a of FIG. 6A, is coated; in step 230, the positive photoresist layer is exposed to patterned activating radiation which provides the pattern of pedestal strips; the pedestal strips are developed in step 240; and in step 250, the pedestal strips are heated to a temperature which causes crosslinking of the pedestal strips, as depicted in FIG. 6C.

In process step 310, a crosslinking inhibition layer, i.e., layer 26a of FIG. 6E is coated; an image reversal photoresist layer, namely, the mask-forming photoresist layer 40a of FIG. 6F, is coated in process step 320; it is patternwise exposed to activating radiation in a process step 330 (see FIG. 6G); in step 332, the substrate is heated to cause the inhibition layer 26a to produce a crosslinking inhibition agent and to diffuse the agent molecules a distance into the mask-forming photoresist layer (see FIG. 6H) while at the same time effecting the crosslinking of the patternwise exposed mask-forming regions; the image reversal photoresist layer is then exposed uniformly to activating radiation in step 335, as shown in FIG. 6I; and in step 340, the mask-forming image reversal photoresist layer is developed to form the vapor deposition masks with undercut side surfaces, as depicted in FIG. 6J.

In a step 460 the EL-medium layer 92 is formed by vapor deposition (see FIG. 4); and, in step 480, the cathode electrodes 94 are formed over the EL-medium layer 92 by vapor deposition, as depicted in FIG. 5. Having now fabricated an organic EL device, or a plurality of devices, the fabrication process is stopped and the device or devices are removed from a cassette to be forwarded to packaging facilities or to testing facilities, as the case may be.

EXAMPLES

The following examples are presented for a further understanding of the present invention. For purposes of clarity, the materials and the layers formed therefrom will be abbreviated as given below.

ITO: indium tin oxide (anode electrodes)

HMDS: hexamethyldisilazane, a conventional adhesion promoter, commercially available from Sigma Chemical Company of St. Louis, Mo.

APX-K1: an adhesion promoter containing trimethoxysilane and ethanolamine, commercially available from Brewer Science, Inc. of Rolla, Mo.

AZ5206: a conventional positive photoresist material useful for forming the pedestal strips, commercially available from Clariant Corporation of Somerville, N.J.

AZ5214: an image reversal photoresist material useful for forming the vapor deposition masks overlying the pedestal strips, commercially available from Clariant Corporation of Somerville, N.J.

AZ312MiF: a photoresist developer, commercially available from Clariant Corporation of Somerville, N.J.

NPB: 4,4'-bis-[N-(1-naphthyl)-N-phenylamino]biphenyl, a material useful for forming a vapor deposited hole-transporting layer over the ITO anode electrodes revealed between the vapor deposition masks Alq: tris(8-quinolinato-N1, 08)-aluminum, a material useful for forming a vapor deposited light-emitting and electron-transporting layer over the NPB hole-transporting layer Mg:Ag: magnesium:silver at a ratio of 10:1 by volume, useful for forming vapor deposited cathode-electrodes over the Alq layer

Example 1

An organic EL device was fabricated by the following process sequence:

1) a glass plate with a plurality of light-transmissive ITO anode electrodes on one surface thereof was cleaned by ultrasonicating in a commercial detergent, rinsing in deionized water, degreasing in toluene vapor, and contacting by a strong oxidizing agent;

2) a 1.5 nm thick adhesion layer was formed over the ITO electrodes and over the substrate therebetween by spin-coating the APX-K1 adhesion promoter;

3) a 0.6 micrometer thick photoresist layer was formed over the adhesion layer by spin-coating the AZ5206 conventional positive photoresist;

3.1) the AZ5206 photoresist layer was exposed to activating radiation in a proximity mode to provide a plurality of parallel laterally spaced exposed lines which had unsharp edges and which were separated from one another by unexposed strips; the lines and the strips were oriented at a right angle to the ITO anode electrodes and extended thereacross;

3.2) an AZ312MiF developer was used to develop the photoresist layer so as to leave a pattern of parallel laterally spaced pedestal strips of previously unexposed photoresist; each pedestal strip had shallowly shaped sidewalls merging with an upper pedestal surface, as observed under an optical microscope;

3.3) the substrate was transported onto a heating station which clamped the uncoated substrate surface thereagainst by a vacuum clamping force for 3 minutes at a heating station temperature adjusted to 225° C., thereby crosslinking the pedestal strips;

4) a 1.5 nm thick crosslinking inhibition layer was formed over and between the pedestal strips by spin-coating the APX-K1 material;

5) a 2.5 micrometer thick mask-forming photoresist layer was formed over the inhibition layer by spin-coating the AZ5214 image reversal photoresist;

5.1) the mask-forming photoresist layer was exposed to activating radiation by a patterning exposure which provided an exposed strip centered over, and substantially congruent with, each one of the pedestal strips;

5.2) the uncoated surface of the substrate was vacuum-clamped against a heating station for 100 seconds at a heating station temperature adjusted to 110° C., thereby releasing a crosslinking inhibition agent from the inhibition layer, diffusing the agent a distance into the AZ5214 photoresist layer, and crosslinking the exposed strips thereof in correspondence with a concentration profile of the inhibition agent in the AZ5214 image reversal photoresist layer;

5.3) the AZ5214 image reversal photoresist layer was uniformly exposed to activating radiation so as to render previously unexposed portions developable;

5.4) the AZ5214 photoresist layer was developed in the AZ312MiF developer for 80 seconds; formed over each pedestal strip was a vapor deposition mask having a width dimension smaller than a width dimension of the pedestal strip, and having undercut and curved mask side surfaces which merged into a mask top surface, as depicted in FIGS. 1A, 1B, and 3;

6) a 75 nm thick NPB hole-transporting layer was formed over the substrate by conventional vacuum evaporation, and in a pattern defined by the integral vapor deposition masks;

7) a 50 nm thick Alq light-emitting layer was formed over the NPB layer by conventional vacuum evaporation;

8) a 150 nm thick Mg:Ag cathode electrode layer was formed over the Alq light-emitting layer by vacuum co-evaporation of Mg and of Ag from independently controlled deposition sources, the integral vapor deposition masks defining a plurality of laterally spaced cathode electrodes therebetween, as schematically shown in FIG. 5.

Example 2

An organic EL device was fabricated by the following process sequence:

1) the cleaning step of Example 1 was repeated using a new glass plate having the ITO anode electrodes;

2) a 1.2 nm thick adhesion layer was formed over the ITO electrodes and over the substrate therebetween by spin-coating the HMDS adhesion promoter (in place of the APX-K1 adhesion promoter of Example 1);

Process steps 3, 3.1, 3.2, 3.3, 4, 5, 5.1, 5.2, 5.3, and 5.4 of Example 1 were repeated; substantially identical pedestal strips and respectively overlying vapor deposition masks were obtained as described in Example 1;

Process steps 6, 7, and 8 of Example 1 were repeated to complete the fabrication sequence of this organic EL device.

Example 3

An organic EL device was fabricated by the following process sequence:

1) the cleaning step of Example 1 was repeated using a new glass plate having the ITO anode electrodes;

Process steps 2, 3, 3.1, 3.2, and 3.3 of Example 1 were repeated; pedestal strips substantially identical to those of Example 1 were obtained;

2) a 1.3 nm thick adhesion layer was formed over and between the pedestal strips by spin-coating the HMDS adhesion promoter (in place of the APX-K1 adhesion promoter/crosslinking inhibition layer);

Process steps 5, 5.1, 5.2, 5.3, and 5.4 of Example 1 were repeated; formed over each pedestal strip was a mask having a width dimension smaller than a width dimension of the pedestal strip; however, the mask side surfaces were straight, substantially vertical, and defining a mask top surface by relatively well-delineated edge contours, as observed under an optical microscope. Since these masks did not have the desired undercut and curved side surfaces contemplated by the method of the invention, the process steps 6, 7, and 8 of Example 1 were not implemented.

The invention has been described in detail with particular reference to certain preferred embodiments thereof, but it will be understood that variations and modifications can be effected within the spirit and scope of the invention.

PARTS LIST 10 organic EL device
12 light-transmissive substrate
14 light-transmissive anode electrodes
16 adhesion layer (after completed process sequence)
16a adhesion layer (as coated)
16b adhesion layer (after heating)
20 pedestal strips (after completed process sequence)
20a pedestal strip-forming positive photoresist layer (as coated)
20b pedestal strips (after developing step)
21 center line
22 patterned activating radiation
23 pedestal strip side surfaces
24 pedestal strip top surface
26 crosslinking inhibition (after completed process sequence)
26a crosslinking inhibition layer (as coated)
26b undercut-promoting crosslinking inhibition layer (after heating)
26c crosslinking inhibition agent
33 heat radiation (to cause crosslinking of pedestal strips)
40 vapor deposition masks (after completed process sequence)
40a mask-forming image reversal photoresist layer (as coated)
40b mask-forming image reversal photoresist layer (in pattern-exposed regions)
40c mask-forming image reversal photoresist layer (after heating; unexposed regions)
40d mask-forming image reversal photoresist layer (after heating; pattern-exposed regions)
40e mask-forming image reversal photoresist layer (after uniform exposure of regions not previously pattern-exposed)
40f mask-forming image reversal photoresist layer (after uniform exposure of previously pattern-exposed regions)
42 mask top surface
44 curvature of mask side surfaces
46 undercut of mask side surfaces
52 patterned activating radiation
53 heat radiation (to produce crosslinking inhibition agent)
62 uniform activating radiation
91 organic EL-medium vapor
92 organic EL-medium layer
93 cathode electrode material vapor
94 cathode electrode
100 anode electrode providing step
210 coating step (adhesion layer)
220 coating step (positive photoresist layer)
230 pedestal pattern exposing step
240 pedestal strip developing step
250 pedestal strip heating step
310 coating step (undercut-promoting crosslinking inhibition layer)
320 coating step (image reversal photoresist layer)
330 mask pattern exposing step
332 heating step to produce crosslinking inhibition agent
335 uniform exposing step
340 mask developing step
460 organic EL-medium forming step
480 cathode electrode forming step
$P_x$ pixel dimension in an x-direction
$P_y$ pixel dimension in a y-direction
$\Theta$ angle of pedestal strip side surfaces
WM width dimension of mask
WP width dimension of pedestal strip

What is claimed is:

1. A method of making an organic electroluminescent (EL) device, comprises:

(a) providing a plurality of laterally spaced and electrically insulative pedestal strips in a spatial relationship over anode electrodes disposed on a substrate;

(b) forming an undercut-promoting crosslinking inhibition layer over the pedestal strips, and of a material which produces a diffusable crosslinking inhibition agent;

(c) providing and patterning an image reversal photoresist layer on the undercut-promoting inhibition layer into an organic vapor deposition mask oriented over each pedestal strip, and having undercut side surfaces which merge with continuous curvature into a mask top surface and wherein the crosslinking inhibition agent has diffused into the organic vapor deposition mask;

(d) forming an organic EL-medium layer between adjacent masks; and (e) forming a plurality of cathode electrodes over the organic EL-medium layer, with the cathode electrodes being laterally spaced by the organic masks.

2. A method of making an organic electroluminescent (EL) device, comprising the steps of:

a) providing a plurality of laterally spaced light-transmissive anode electrodes over a light-transmissive substrate;

b) forming a plurality of laterally spaced organic electrically insulative pedestal strips over the anode electrodes and over the substrate, and in an oriented spatial relationship with respect to the anode electrodes;

c) forming an undercut-promoting crosslinking inhibition layer over the pedestal strips and over such portions of the anode electrodes and the substrate remaining between the pedestal strips, and of a material capable of producing and releasing a crosslinking inhibition agent when heated;

d) providing an image reversal photoresist layer on the inhibition layer;

e) exposing the image reversal photoresist layer to activating radiation and with a pattern of exposure selected to be substantially congruent with the pedestal strips;

f) heating the substrate to a temperature sufficient to cause the crosslinking inhibition layer to produce a crosslinking inhibition agent which is capable of diffusing a distance into the image reversal photoresist layer;

g) exposing the image reversal photoresist layer uniformly to activating radiation;

h) developing the image reversal photoresist layer to provide vapor deposition masks over the pedestal strips wherein the crosslinking inhibition agent which has decreasing concentration in the image reversal photoresist layer throughout the distance of diffusing from the inhibition layer promotes a higher development rate of the image reversal photoresist layer at an interface thereof with the inhibition layer so that each of the vapor deposition masks has undercut side surfaces which merge under continuous curvature at a common mask top surface which extends substantially parallel with the substrate;

i) forming an organic EL-medium layer over the anode electrodes by vapor deposition of an organic EL-medium between the vapor deposition masks; and j) forming a plurality of laterally spaced cathode electrodes over the EL-medium layer by vapor deposition of a cathode electrode material between the vapor deposition masks.

3. The method of claim 2 wherein the pedestal strip-forming step includes the steps of:

i) forming an adhesion layer over the substrate and over the anode electrodes;

ii) providing a positive photoresist layer over the adhesion layer;

iii) exposing the positive photoresist layer to activating radiation and with a pattern selected to provide pedestal strips which, when developed, will have a pedestal top surface substantially parallel with the substrate and pedestal side surfaces sloping downwardly to the adhesion layer at an angle of less than 60 degrees with respect to the pedestal top surface;

iv) developing the positive photoresist layer to provide the pedestal strips; and v) heating the pedestal strips to a temperature sufficient to cause the positive photoresist of each of the pedestal strips to crosslink so as to form structurally and chemically stable pedestal strips having a pedestal width dimension WP.

4. The method of claim 2 wherein the image reversal photoresist pattern-exposing step, the substrate heating step, the image reversal photoresist uniformly exposing step, and the image reversal photoresist developing step are selected to provide a vapor deposition mask having a mask width dimension WM, and disposed centrally over a pedestal strip having a pedestal width dimension WP, wherein WM/WP is in a range of 0.4–0.95.

5. The method of claim 2 wherein the organic EL-medium layer forming step includes the steps of:

i) forming an organic hole-transporting layer over the anode electrodes; and ii) forming an organic light-emitting layer over the hole-transporting layer.

6. The method of claim 2 wherein the substrate heating step produces a crosslinking inhibition agent comprised of amine molecules.

7. The method of claim 2 wherein the substrate heating step further includes crosslinking the exposed pattern of the image reversal photoresist layer in a relationship with respect to the diffused crosslinking inhibition agent.

8. The method of claim 7 wherein crosslinking of the exposed pattern of the image reversal photoresist layer is progressively retarded as a concentration of the diffused crosslinking inhibition agent is increasing.

* * * * *